United States Patent [19]
Akahoshi et al.

[11] Patent Number: 5,294,291
[45] Date of Patent: Mar. 15, 1994

[54] PROCESS FOR THE FORMATION OF A CONDUCTIVE CIRCUIT PATTERN

[75] Inventors: Haruo Akahoshi, Hitachi; Toshinari Takada, Hadano; Fujiko Yutani; Takeyuki Itabashi, both of Hitachi; Shin Nishimura, Katsuta; Satoru Amo, Hitachi; Akio Takahashi, Hitachiota; Rituji Toba; Masashi Miyazaki, both of Hadano, all of Japan

[73] Assignee: Hitachi, Ltd., Tokyo, Japan

[21] Appl. No.: 947,543

[22] Filed: Sep. 21, 1992

[30] Foreign Application Priority Data

Sep. 20, 1991 [JP] Japan .................. 3-241962

[51] Int. Cl.$^5$ .................. B44C 1/22; C23F 1/00
[52] U.S. Cl. .................. 156/637; 156/638; 156/634; 156/651; 156/656; 156/902
[58] Field of Search ............. 156/634, 637, 638, 640, 156/650, 651, 655, 656, 666, 901, 668, 902, 904; 252/79.2, 79.5; 29/846; 427/96, 98; 430/313, 314, 318, 315, 329

[56] References Cited

U.S. PATENT DOCUMENTS

| | | | |
|---|---|---|---|
| 4,157,936 | 6/1979 | Piazza | 156/659.1 |
| 4,304,681 | 12/1981 | Martin et al. | 252/143 |
| 4,976,808 | 12/1990 | Ogasawara | 156/638 |
| 5,112,440 | 5/1992 | Bank et al. | 156/659.1 |

FOREIGN PATENT DOCUMENTS

60-206190 10/1986 Japan .
1-13794 1/1989 Japan .
1-261888 10/1989 Japan .

Primary Examiner—William A. Powell
Attorney, Agent, or Firm—Antonelli, Terry, Stout & Kraus

[57] ABSTRACT

A process is provided for the formation of a conductive circuit pattern on a base metal formed on a substrate. On the base metal, a plating resist is first provided in a pattern corresponding to the circuit to be formed and a circuit pattern is then formed by plating. The plating resist is treated with a stripper and then with a stripping residue remover to cut off chemical bonds in the resist by a dehydrating decomposition reaction. The base metal is treated with an etchant for the base metal, whereby any resist residue still remaining after the treatment with the stripping residue remover is removed and the base metal are etched at areas which were covered by the plating resist.

36 Claims, 2 Drawing Sheets

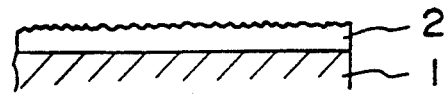
FIG. 2(a)
PRIOR ART
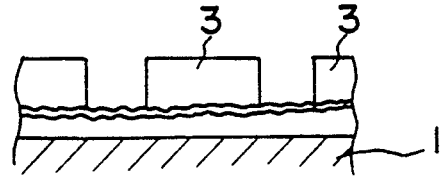
FIG. 2(b)
PRIOR ART
FIG. 2(c)
PRIOR ART
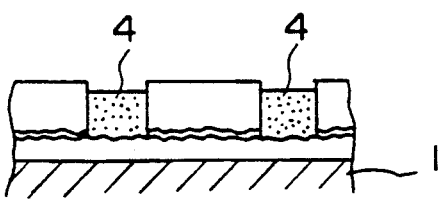
FIG. 2(d)
PRIOR ART
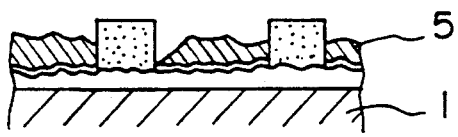
FIG. 2(e)
PRIOR ART
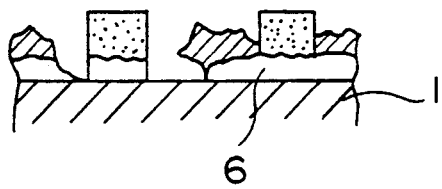
FIG. 2(i)
PRIOR ART

PROCESS FOR THE FORMATION OF A CONDUCTIVE CIRCUIT PATTERN

BACKGROUND OF THE INVENTION

1. Field of the Invention

This invention relates to a process for the formation of a circuit of a printed circuit board, and especially to a process for the formation of a conductive circuit pattern of a printed circuit board, which is well suited for forming a microcircuit pattern at a high density.

2. Description of the Related Art

As a process for forming a conductive circuit pattern of a printed circuit board, it has heretofore been the common practice to use a copper clad laminate as a starting material, to provide an etching resist at circuit-forming areas and then to remove a copper foil at areas other than the circuit areas by etching.

Etching, however, proceeds not only in the direction of the thickness of the circuit but also in its widthwise direction, so that the cross-sectional profile of the circuit is not rectangular but is trapezoidal with its width broader on a side of a substrate. It has therefore been difficult to obtain a sufficient circuit cross-sectional area when the wiring density becomes high and the width of each conductive strip becomes closer to the thickness of the circuit. Further, the dimensional accuracy of a circuit is determined by the extent of variations in etched quantity, leading to the problem that it is difficult to form a microcircuit pattern at high accuracy.

To form such high density wiring, a pattern plating method is therefore used instead of the usual etching.

According to the pattern plating method, a copper clad laminate is used as a starting material. A plating resist is applied on a copper foil at areas where no circuit is to be formed. The copper foil is plated at areas not covered with the plating resist, namely, at circuit-forming areas, whereby a conductive circuit pattern is formed. Thereafter, the plating resist is removed and the base copper is removed at the areas other than the circuit by etching, whereby an independent circuit is formed.

Since the conductive circuit pattern is formed in exactly the same pattern as the pattern of the plating resist in this method, the accuracy of formation of a circuit width is determined by the accuracy of formation of the plating resist. It is therefore possible to form a microcircuit pattern by using a photo-imagable plating resist and forming a resist pattern by a lithographic process.

For such a pattern plating method, it is essential to have a plating resist sufficiently adhered on a substrate so as to prevent delamination or blistering in a plating step and also to completely peel of the plating resist after completion of the plating. In other words, mutually contradictory characteristics are required, including high adhesion up to the plating step and good peelability in the resist peel-off step. When the formation of a conductive circuit pattern is conducted by electroless copper plating in particular, the resist tends to peel off or blister in the plating step so that improvements are required in the adhesion of the plating resist.

As methods for improving the adhesion of a plating resist to prevent peeling or blistering in a plating step, there are methods disclosed, for example, in Japanese Patent Application Laid-Open (Kokai) Nos. SHO 64-13794 and HEI 1-261888.

To strip off a resist, a chlorinated organic solvent such as dichloromethane or an alkaline resist stripper is generally used depending on the properties of the resist. As a result of an improvement in the adhesion of a resist by the method described above, the above stripping treatment cannot completely remove the resist so that residual resist may still remain locally in a state adhered on the base copper foil at areas other than the circuit areas.

The remainder of such resist residue leads to a failure in removing the copper at such non-circuit areas in the subsequent etching step, thereby causing defects such as short circuits and insufficient inter-strip spacing.

To remove any adhered residual resist, Japanese Patent Application Laid-Open (Kokai) No. SHO 60-206190 therefore discloses a method in which any remaining photoresist is dipped in a strong acid and then brushed off by an acid-resistant brush.

Use of a mechanical method such as brushing for the removal of resist residue as in the above-described conventional technique, however, tends to damage, peel off or cut off the microcircuit pattern.

SUMMARY OF THE INVENTION

An object of this invention is to provide a process for the formation of a conductive microcircuit pattern, which process permits complete removal of a plating resist without cutting or damaging conductive strips upon removal of the resist.

To attain the above object, the present invention provides a process for the formation of a conductive circuit pattern on a base metal formed on a substrate, which comprises the following steps:

providing on the base metal a plating resist in a pattern corresponding to the circuit to be formed and then forming a circuit pattern by plating;

treating the plating resist with a stripper and then with a stripping residue remover to cut off chemical bonds in the resist by a dehydrating decomposition reaction; and treating the base metal with an etchant for the base metal, whereby any resist residue still remaining after the treatment with the stripping residue remover is removed and the base metal is etched at areas which were covered by the plating resist.

If the etching treatment for the removal of resist residue and the etching treatment for the removal of the base metal at areas other than those corresponding to the circuit are conducted successively with the same etchant, etching irregularity may take place between areas where the removal of resist residue proceeds fast and areas where the removal of resist residue proceeds slowly, resulting in the possible occurrence of such undesirable effects as the accuracy of the inter-strip width being lowered and short circuits occurring due to remaining unetched base metal. In order to avoid such problems, it is effective to practice as separate steps the etching treatment for the removal of resist residue and the etching treatment for the removal of the base metal at areas other than those corresponding to the circuit. In this case, it is also effective to conduct the first etching step by using an etchant having a lower etch rate than an etchant for the second etching step in which the base metal is etched in the state where the resist residue has been removed. In particular, still better results can be obtained when the etch rate of the base metal in the first etching step is 1 $\mu$m/min or lower.

For more effective removal of the resist residue, it is effective to apply ultrasonic waves to the stripping residue remover or to spray the stripping residue remover against the substrate. It is also effective to include a water washing step, in which ultrasonic treatment or spray water washing is conducted, after the treatment with the stripping residue remover or after the first etching step. It is also effective to apply ultrasonic treatment or to spray the etchant against the substrate in the first etching step.

In another aspect of this invention, there is also provided a process for the formation of a conductive circuit pattern, which comprises the following steps:

providing a second base metal layer on a first base metal layer formed on a substrate;

providing on the second base metal a plating resist in a pattern corresponding to the circuit to be formed and then forming a circuit pattern by plating;

treating the plating resist first with a stripper and then with a stripping residue remover, to cut off chemical bonds in the resist by a dehydrating decomposition reaction;

treating, as a first etching step, the second base metal layer with an etchant for the second base metal layer, whereby the second base metal layer and any resist residue are removed; and etching, as a second etching step, the first base metal layer with an etchant for the first base metal layer subsequent to the first etching step.

In the process according to the second aspect, use of an etchant for the second base metal layer, which enables selective etching of the second base metal layer, and not the first base metal makes it possible to reduce etching irregularity upon removal of the resist residue and, therefore, is effective in obtaining highly-accurate, fine conductive strips. The etching rate of the first base metal layer in the first etching step is preferably 1.0 μm/min or lower.

Similarly to the process according to the first aspect of this invention described above, water spray and/or ultrasonic treatment can also be used in the process according to the second aspect of this invention.

According to the present invention, it is possible to remove adhered residues still remaining after removal of the plating resist or to remove adhered residues without preliminarily treating the plating resist with a resist stripper by selecting the resist remover treatment conditions so that occurrence of unetched base metal portions due to the adhesion of the resist residues can be prevented. As a consequence, the present invention can form a microcircuit pattern free of defects such as short circuit.

BRIEF DESCRIPTION OF THE DRAWINGS

The above and other objects, features and advantages of the present invention will become apparent from the following description and the appended claims, taken in conjunction with the accompanying drawings, in which:

FIGS. 2(a)-2(e) and 2(i) schematically shows a conventional process for the formation of a conductive circuit pattern.

DETAILED DESCRIPTION OF THE PREFERRED EMBODIMENT

Figure 1A:
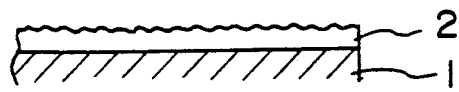
FIGS. 1(a)-1(h) schematically illustrates a process according to one embodiment of this invention for the formation of a conductive circuit pattern.

Usable examples of the stripping residue remover, which cuts off chemical bonds in the resist by a dehydrating decomposition reaction, include sulfuric acid; hydrobromic acid; hydroiodic acid; and alcohol solutions of the hydroxides of alkali metals such as lithium, sodium and potassium. Of these, sulfuric acid is extremely effective.

Regarding the concentration of sulfuric acid, use of concentrated sulfuric acid having a concentration of 60% or higher is more effective although a concentration of 20% or so is still effective. For a plating resist whose strippability is especially poor, good results can be obtained when concentrated sulfuric acid having a concentration of 80% or higher is used and the treatment is conducted at a temperature of 30° C. or higher.

Illustrative of the plating resist are screen printing resists and photo-imagable resists. For the formation of a high-accuracy pattern, a lithographic process making use of a photo-imagable resist is effective. A resist pattern is formed, for example, by laminating a dry film photoresist through hot rolls, exposing the photoresist through a photomask to form a pattern image and then developing the thus-exposed photoresist.

Instead of such a dry film photoresist, a liquid photoresist can be coated as a photoresist by a coating method such as screen coating, roll coating or curtain coating. Especially, use of a resist formed by using as a primary component a compound containing one or more ester or ether bonds such as one or more acryloyl or methacryloyl groups or one or more epoxy groups permits effective removal of any resist residue after the stripping step when combined with the treatment for the stripping residue remover, which cuts off chemical bonds in the resist by a dehydrating decomposition reaction, and also with the treatment of the base metal with the etchant.

Where the plating for the formation of the circuit pattern is electroless copper plating, peeling of the resist tends to occur especially in the plating step so that additional treatment is generally applied to enhance the adhesion between the resist and the base metal. The present invention is particularly effective when electroless copper plating is conducted.

In the foregoing description, there is mentioned a method in which a major portion of the resist is first removed by a stripper and a resist residue remaining after the removal by the stripper is then removed by using a stripping residue remover. However, if the conditions for the treatment with the stripping residue remover are selected appropriately, the treatment with the stripper is not necessarily needed and may be omitted. In this connection, it is to be noted that the stripping residue remover used here may also referred to as "resist remover".

The effective removal of the adhered residue of the resist by the present invention appears to be attributable to the following action.

When the resist residue adhered on the base metal is treated are dissolved or cracks or pinholes are formed there or the resist itself is rendered hydrophilic to permit increased penetration by the etchant. As a result, the resist residue is changed into such a state that the etchant is allowed to easily penetrate to the interface between the resist residue and the base metal.

At this stage, the resist residue still cannot be dissolved completely and, because the resist residue is in close adhesion with the substrate, it is still difficult to peel off the resist residue. When etching treatment is applied to the base metal subsequent to the above treatment, the interface between the resist and the base metal is etched as the resist has been changed to a state permitting easy penetration of the etchant to the interface. As a consequence, the resist residue which has firmly adhered to the base metal loses adhesion so that it can be easily peeled off. Where the adhesion is particularly strong, the resist residue may not be peeled off completely when etching alone is applied. In such a case, combined application of mechanical treatment such as spraying or ultrasonic treatment can promote the removal.

One embodiment of the present invention will next be described with reference to FIG. 1 which shows a conductive circuit pattern and base materials in cross-section.

FIG. 1(a) is a cross-sectional view of an insulating substrate 1 with a base metal layer 2 formed thereon. As the base metal layer 2, copper is generally used in printed circuit boards. As the insulating substrate 1, a glass-epoxy resin laminate, a glass-polyimide laminate or the like can be used. As these insulating substrate 1 and base metal layer 2, a product commercially available as a copper clad substrate can be used. The base metal layer 2 is not necessarily limited to a single layer, but a plurality of layers may be provided as the base metal layer 2.

Figure 1B:
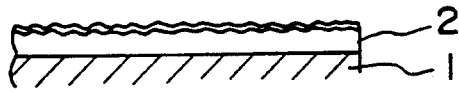

FIG. 1(b) shows the base metal surface 2 whose surface has been roughened to improve the adhesion of a plating resist. Where the below-described formation of a conductive circuit pattern in FIG. 1(d) is conducted by electroless copper plating, in particular, the resist tends to be peeled off or to blister in the plating step so that some adequate adhesion enhancing treatment is essential. It is however to be noted that such surface roughening can be practiced as needed and is not a step essential to the present invention.

Figure 1C:
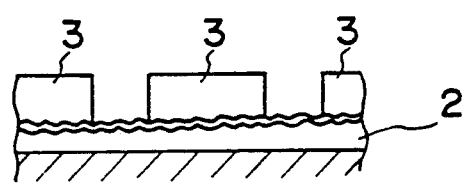
Figure 1D:
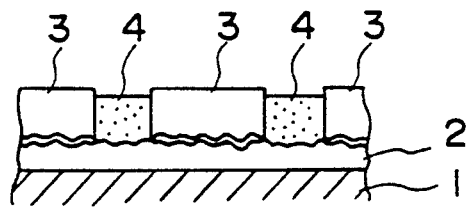

Next, a plating resist 3 is formed on the base metal layer 2 [see FIG. 1(c)]. Examples of processes for the formation of a plating resist pattern include a lithographic process in which a photo-imagable resist is used in accordance with the screen printing technique. A lithographic process is advantageous for the formation of a high-accuracy pattern. For example, a dry film photoresist is laminated through hot rolls and, subsequent to imagewise exposure via a photomask, the photoresist is developed to form a resist pattern. Instead of such a dry film photoresist, a liquid photoresist can also be coated as a photoresist by a coating method such as screen coating, roll coating or curtain coating.

Thereafter, a conductive circuit pattern 4 is formed by plating [see FIG. 1(d)]. In the case of a printed circuit board, copper plating is generally employed for the formation of the conductive circuit pattern 4. It is formed by electrolytic copper plating, electroless copper plating or the like. Although electrolytic copper plating is widely used in general, electroless copper plating is superior in terms of the thickness uniformity of the resulting plating.

Figure 1E:
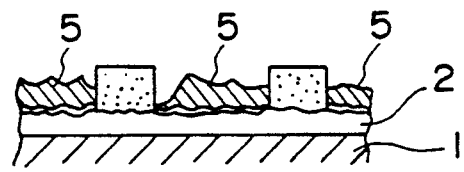

The plating resist 3 is then peeled off with a resist remover. To peel off the resist, a chlorinated organic solvent such as dichloromethane is generally used where the resist is of the solvent developable type but an alkaline resist remover is often used where the resist is of the alkali-developable type. When the adhesion of the plating resist 3 becomes higher, the resist cannot be removed completely by such peeling treatment so that, as is illustrated in FIG. 1(e), resist residues 5 remain on the base copper foil at areas other than the circuit. If etching of the base copper foil is conducted in this state, unetched portions 6 remain underneath the resist residues 5 as shown, as a comparative example, in FIG. 2(i). Incidentally, the treatments in FIG. 2(a) to FIG. 2(e) are the same as the treatments in FIG. 1(a) to FIG. 1(e).

Figure 1F:
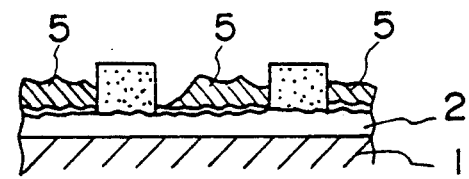
Figure 1G:
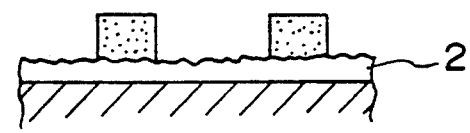

Different from the foregoing, subsequent to the resist peeling treatment [see FIG. 1(e)], any resist residues are treated with a peeling residue remover which cuts off chemical bonds in the resist by a dehydrating decomposition reaction [see FIG. 1(f)], followed by the further treatment with an etchant for the base metal. This makes it possible to effectively remove the resist residues [see FIG. 1(g)].

Usable examples of the stripping residue remover include sulfuric acid; hydrobromic acid; hydroiodic acid; and alcohol solutions of the hydroxides of alkali metals such as lithium, sodium and potassium. Of these, sulfuric acid is extremely effective.

Regarding the concentration of sulfuric acid, use of concentrated sulfuric acid having a concentration of 60% or higher is more effective although a concentration of 20% or so is still effective. For a plating resist whose strippability is especially poor, good results can be obtained when concentrated sulfuric acid having a concentration of 80% or higher is used and the treatment is conducted at a temperature of 30° C. or higher. In addition, the efficiency of removal of the resist residues 5 can be improved by applying ultrasonic waves or spraying the etchant for the base metal layer 2 upon removal of the resist residues 5 by treating the same with the etchant.

Figure 1H:
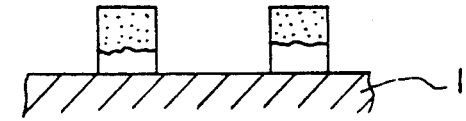

The base metal layer 2 at areas other than the circuit pattern is then removed by etching, whereby a microcircuit pattern free of defects such as unetched metal portions can be formed [FIG. 1(h)].

The above steps will hereinafter be described individually in detailed by some more specific examples.

EXAMPLE 1

Step 1

A double-sided, glass-polyimide copper clad laminate, which had copper layers of 12 μm in thickness and a base material of 0.1 mm in thickness, was cut into a predetermined size. One of the copper surfaces was polished by brushing.

Step 2

After the laminate was washed with water, it was treated for 1 minute in a soft etchant of the following composition (I), which was controlled at 30° C., in order to roughen the surface.

Composition (I)

| Ammonium persulfate | 200 g/l |
|---|---|
| 97% Sulfuric acid | 5 ml/l |

Step 3

To further roughen the copper surface, the laminate was immersed at 70° C. for 2 minutes in a treatment solution of the following composition (II) so that an oxide film layer was formed on the surface.

Composition (II)

| | |
|---|---|
| NaClO$_2$ | 100 g/l |
| Na$_3$PO$_4$.12H$_2$O | 30 g/l |
| NaOH | 12 g/l |

Step 4

After the laminate was washed with water, it was immersed at 45° C. for 1 minutes in a treatment solution of the following composition (III) so that the oxide film layer was reduced.

Composition (III)

| | |
|---|---|
| Dimethylaminoboran | 10 g/l |
| NaOH | 10 g/l |

Step 5

After the laminate was washed with water, it was plated at 20° C. and 0.05 A/dm$^2$ for 6 minutes in a nickel plating solution of the following composition (IV) so that a thin nickel plating layer corresponding to the above-described second base metal layer was formed on the surface of the copper layer. In this case, the thickness of the nickel plating layer was 0.06 μm.

Composition (IV)

| | |
|---|---|
| NiSO$_4$.6H$_2$O | 200 g/l |
| NaCl | 15 g/l |
| H$_3$BO$_3$ | 15 g/l |

The laminate was next washed with water, whereby a substrate having a roughened surface was obtained.

Step 6

After the surface of the substrate was thoroughly dried, a dry film photoresist containing a photo-imagable resin composition layer (35 μm in thickness) of the following composition was laminated through hot rolls. At that time, the hot roll temperature and lamination velocity were controlled at 100° C. and 1 m/min, respectively.

Composition (V)

| | Parts by weight |
|---|---|
| Trimethylolpropane triacrylate | 20 |
| Tetraethylene glycol diacrylate | 20 |
| Polymethyl methacrylate | 60 |
| (Weight average molecular weight: approximately 120,000) | |
| Benzophenone | 6 |
| 4,4'-Bis(diethylamino)benzophenone | 0.1 |
| Victoria Pure Blue | 0.05 |
| Hydroquinone | 0.1 |

Step 7

After the laminated substrate was allowed to cool down for about 5 minutes, the photoresist was masked at an area where a circuit pattern was to be formed, followed by exposure at 100 mJ/cm$^2$ by an extra-high pressure mercury vapor lamp exposure system. As a developer, 1,1,1-trichloroethane was then sprayed at about 25° C. for 2 minutes against the thus-exposed photoresist so that the photoresist was developed. As a consequent, the areas other than the circuit pattern were successfully masked with the plating resist.

Step 8

The substrate with the patterned resist formed thereon was next treated for 2 minutes with the soft etchant of the composition (I), whereby the nickel film was removed at the area where the circuit pattern was to be formed.

Step 9

After the substrate was washed with water, it was immersed at 70° C. for 12 hours in an electroless copper plating solution of the following composition (VI) so that a conductive circuit pattern of about 30 μm in thickness was formed.

Composition (VI)

| | |
|---|---|
| Copper sulfate pentahydrate | 10 g/l |
| Disodium ethylenediamine-tetraacetate dihydrate | 30 g/l |
| 37% Aq. formaldehyde solution | 3 g/l |
| NaOH | q.s. to pH 12.6 |
| 2,2'-Dipyridyl | 30 mg/l |
| Polyethylene glycol (Average molecular weight: 600) | 10 g/l |

Step 10

Subsequent to the plating, the substrate was thoroughly washed with water. After the substrate was immersed in its entirety for 2 minutes in a 10% aqueous solution of sulfuric acid, the substrate was solder-plated at 1 A/dm$^2$ for 15 minutes in a solder plating solution of the following composition (VII).

Composition (VII)

| | |
|---|---|
| Sn(BF$_4$)$_2$ | 15 g/l (as Sn) |
| Pb(BF$_4$)$_2$ | 10 g/l (as Pb) |
| H$_3$BO$_3$ | 40 g/l |
| HBF$_4$ | 300 g/l |

Step 11

Next, methylene chloride of 30° C. was sprayed for 10 minutes against the substrate to peel off any resist on the substrate. Residues of the plating resist however remained adhering on the base metal at areas other than the circuit pattern.

Step 12

The substrate was immersed for 5 minutes in 95% sulfuric acid as a stripping residue remover for the resist, the sulfuric acid having been maintained at 30° C., whereby the resist residues were subjected to a dehydrating decomposition reaction.

Step 13

After the substrate was washed with water, it was subjected to etching for 1 minute in the soft etchant of the composition (I) while ultrasonic waves were being applied. Incidentally, the etching of this step corresponds to the first etching described above.

As a result, the base copper foil was etched to a depth of about 0.8 μm. By that etching treatment, the resist residues had been all removed from the surface of the base metal surface.

Step 14

Subsequent to washing of the substrate with water, the base copper foil was etched off at the areas other than the circuit pattern with an etchant of the following composition (VIII). Incidentally, the etching of this step corresponds to the second etching described above. The etch rate was 8 μm/min.

Composition (VIII)

| 97% Sulfuric acid | 150 ml/l |
| 85% Phosphoric acid | 20 ml/l |
| Hydrogen peroxide solution (35%) | 100 ml/l |

As has been described above, the conductive circuit pattern formed by the treatments in Step 1 to Step 14 was free of any unetched copper at the areas other than the circuit pattern so that a high-accuracy circuit pattern was successfully formed without defects.

COMPARATIVE EXAMPLE 1

Etching of a base copper foil at areas other than a circuit pattern was attempted by treating the substrate of Example 1, which substrate was before the treatment with sulfuric acid and was employed as was, with the etchant of the composition (VIII), in other words, by conducting the treatment of Step 14 immediately after Step 11 without performing Steps 12 and 13 described above.

As a result, most resist residues remained, as they were, on the surface of the base copper and the base copper was not etched underneath the remaining resist residues. There were accordingly some areas where the inter-strip space was narrower than the corresponding design value or adjacent conductive strips were short-circuited.

To demonstrate differences in effects under varied conditions, experiments were conducted following Example 1 as a basis while modifying the conditions in various ways. The results will be described below.

Example 2 to Example 15 are examples in which the nickel plating step (Step 5) was not conducted, in other words, in which the second base metal layer was not provided. On the other hand, Example 16 to Example 23 are examples in which a second base metal layer was formed in Step 5.

EXAMPLES 2–6

The treatment time of the soft etching treatment of Step 13, namely, of the first etching was varied in these examples. These examples were therefore conducted to determine any influence by the treatment time.

As has already been described above, the nickel plating step (Step 5) was omitted so that no second base metal layer was provided.

Provided as a mask to be employed in Step 6 was a test pattern mask having 200 parallel patterns which consisted of 20 sets of 10 parallel patterns having a conductive strip width of 100 μm, an inter-strip interval of 200 μm and a length of 100 mm. Exposure was conducted using the test pattern mask. Further, the plating in Step 9 was conducted by electrolytic copper sulfate plating in place of the electroless copper plating in Example 1, whereby a conductive circuit pattern of 30 μm in thickness was formed.

Except for the modifications described above, treatments were conducted as in Example 1 so that substrates were fabricated for evaluation purpose.

Evaluation of each substrate so fabricated was performed by visually counting resist residues after Step 13. In addition, after Step 14, the numbers of unetched copper portions and unduly wide conductive strips due to under-etching as well as the numbers of pattern losses and unduly narrow conductive strips due to over-etching were counted similarly. The results are summarized in Table 1.

TABLE 1

| Ex. | First etching time (second) | Etched depth of base copper by first etching (μm) | Resist residues (pieces) | Unetched copper portions (locations) | Pattern loss or narrowing (locations) |
| --- | --- | --- | --- | --- | --- |
| 2 | 30 | 0.4 | 96 | 9 | 0 |
| 3 | 60 | 0.8 | 8 | 0 | 0 |
| 4 | 120 | 1.6 | 0 | 0 | 0 |
| 5 | 180 | 2.5 | 0 | 0 | 0 |
| 6 | 300 | 4.5 | 0 | 0 | 0 |

As is understood from Table 1, the present invention has been found to be effective in substantially decreasing the occurrence of defects and the like.

COMPARATIVE EXAMPLE 2

The procedures of Example 2 were followed except that the etching treatment of Step 13 was omitted to conduct the etching treatment of Step 14 following Step 12. In other words, the first etching time was set at 0 seconds.

The number of defects in the thus-formed circuit pattern was counted as in Examples 2–6. The results are presented in Table 2.

TABLE 2

| Comp. Ex. | First etching time (second) | Etched depth of base copper by first etching (μm) | Resist residues (pieces) | Unetched copper portions (locations) | Pattern loss or narrowing (locations) |
| --- | --- | --- | --- | --- | --- |
| 2 | 0 | — | Resist adhered over the entire surface | >500 | >500 |

As is evident from Table 2, the resist remained over substantially the entire surface even before Step 14 because the first etching treatment was not conducted. Probably because of this, an extremely large number of defects including both unetched copper portions and pattern losses were observed even after Step 14.

EXAMPLES 7–10

These examples were conducted primarily to study any differences in effects depending on the strength of the etchant used in the first etching.

For this purpose, an etchant stronger than the etchant used in Examples 2–6, specifically, an etchant similar to the etchant of the composition (VIII) except that the amount of the hydrogen peroxide solution was decreased to 50 ml/l was used to conduct the etching of Step 13.

The other conditions are similar to the corresponding conditions in Examples 2-6. Incidentally, the treatment time was also changed in Examples 7-10.

The results of an evaluation conducted in a similar manner to Examples 2-6 are summarized in Table 3.

TABLE 3

| Ex. | First etching time (second) | Etched depth of base copper by first etching (μm) | Resist residues (pieces) | Unetched copper portions (locations) | Pattern loss or narrowing (locations) |
|---|---|---|---|---|---|
| 7 | 15 | 0.8 | 325 | 29 | 35 |
| 8 | 30 | 1.7 | 113 | 21 | 19 |
| 9 | 60 | 3.5 | 0 | 15 | 32 |
| 10 | 90 | 6.5 | 0 | 19 | 22 |

As can be seen from Table 3, the resist was completely removed when treated for 60 seconds or longer. As is also understood from a comparison with Table 2, the number of pattern defects decreased considerably compared to Comparative Example 2.

In contrast, a comparison with Table 1 indicates that the number of defects somewhat increased. This appears to be attributable to a failure in causing etching to proceed evenly between areas, where resist residues existed, and other area, where no resist residues existed, because of an unnecessarily high etch rate in the first etching.

EXAMPLES 11-15

These examples were conducted primarily to study any effects when the etching treatment of Step 13, which was conducted under ultrasonic waves in Examples 2-6, was changed to spray etching.

The other conditions are similar to the corresponding conditions in Examples 2-6. The results of an evaluation conducted in a similar manner to Examples 2-6 are shown in Table 4.

TABLE 4

| Ex. | First etching time (second) | Etched depth of base copper by first etching (μm) | Resist residues (pieces) | Unetched copper portions (locations) | Pattern loss or narrowing (locations) |
|---|---|---|---|---|---|
| 11 | 30 | 0.5 | 268 | 93 | 10 |
| 12 | 60 | 0.7 | 99 | 25 | 5 |
| 13 | 120 | 1.5 | 30 | 11 | 20 |
| 14 | 180 | 2.5 | 10 | 0 | 13 |
| 15 | 300 | 4.6 | 0 | 0 | 0 |

As is understood from a comparison with Table 1, a somewhat longer time is required for the removal of resist compared to the application of ultrasonic treatment. It has, however, been found that an extension in the treatment time makes it possible to completely remove the resist and hence to make pattern defects fewer.

EXAMPLES 16-19

Different from Examples 2-15 described above, these examples are directed to the application of the nickel plating step (Step 5), in other words, to the provision of the second base metal layer.

Provided as a mask to be employed in Step 6 was a test pattern mask having 200 parallel patterns which consisted of 20 sets of 10 parallel patterns having a conductive strip width of 70 μm, an inter-strip interval of 130 μm and a length of 100 mm. Exposure was conducted using the test pattern mask. A dry film resist in which the thickness of a layer of a photo-imagable resin composition was 75 μm was used.

The electroless copper plating in Step 9 was conducted for 26 hours, whereby a conductive circuit pattern of about 65 μm in thickness was obtained.

Similar treatments to those of Example 1 were conducted except for the modifications described above, whereby a substrate was fabricated for evaluation.

The substrate was evaluated similarly. The results are summarized in Table 5.

TABLE 5

| Ex. | First etching time (second) | Etched depth of base copper by first etching (μm) | Resist residues (pieces) | Unetched copper portions (locations) | Pattern loss or narrowing (locations) |
|---|---|---|---|---|---|
| 16 | 60 | 0.8 | 158 | 83 | 20 |
| 17 | 120 | 1.6 | 93 | 72 | 21 |
| 18 | 180 | 2.5 | 57 | 36 | 14 |
| 19 | 300 | 4.5 | 35 | 10 | 5 |

EXAMPLES 20-23

These examples were conducted primarily to study the effects when, as the etchant employed in the etching treatment in Step 13, an etchant capable of selectively etching the second base metal was used. In these examples, a nickel-selective etchant was used. Incidentally, the specific composition of the nickel-selective etchant is as shown by the following composition (IX).

Composition (IX)

| 97% Sulfuric acid | 30 ml/l |
|---|---|
| 70% Nitric acid | 100 ml/l |
| 85% Phosphoric acid | 15 ml/l |
| 1,2,3-Benzotriazole | 0.2 g/l |
| Hydrogen peroxide solution (35%) | 30 ml/l |

The other conditions are the same as the corresponding conditions in Examples 20-23.

By changing the etching time of Step 13, substrates were fabricated for evaluation. Defects in the circuit were evaluated. The results are summarized in Table 6.

TABLE 6

| Ex. | First etching time (second) | Etched depth of base copper by first etching (μm) | Resist residues (pieces) | Unetched copper portions (locations) | Pattern loss or narrowing (locations) |
|---|---|---|---|---|---|
| 20 | 60 | 0.15 | 85 | 15 | 4 |
| 21 | 120 | 1.3 | 43 | 7 | 3 |
| 22 | 180 | 0.4 | 5 | 0 | 0 |
| 23 | 300 | 0.8 | 0 | 0 | 0 |

As is evident from a comparison between Table 5 and Table 6, it is understood that, where plural base metal layers are provided, defects and the like can be reduced by using selective etchants suited for the respective layer.

COMPARATIVE EXAMPLE 3

Instead of conducting Step 13, a surface was rubbed by the acid-resistant brush described above as in the prior art. Except for this, procedures were similar to those of Examples 20-23.

The resist was removed at areas where no conductive strips were formed and at areas where the inter-strip space is wide. The resist was however not completely removed at its peripheral edges and between parallel conductive strips, so that unetched copper portions were observed even after the etching. Defects, such as pattern losses, probably due to damage caused by brushing, were also observed.

EXAMPLE 24

This example was conducted in a manner substantially the same as Example 1 except that the treatment with the stripper was omitted. More specifically, the step 11 was omitted, and instead, the step 12 and step 13 were modified as follows:

Step 12'

The substrate was immersed for 20 minutes in 95% sulfuric acid as a stripping residue remover for the resist, the sulfuric acid having been maintained at 40° C., whereby the resist was subjected to a dehydrating decomposition reaction.

Step 13'

After the substrate was washed with water for 10 minutes, it was subjected to etching for 5 minutes in the soft etchant of the composition (IX) while ultrasonic waves were being applied. Incidentally, the etching of this step corresponds to the first etching described above.

As a result, the base copper foil was etched to a depth of about 0.7 $\mu$m. By that etching treatment, the resist had been all removed from the surface of the base metal surface.

The conductive circuit pattern formed by the treatments of this example was free of any unetched copper at the areas other than the circuit pattern so that a high-accuracy circuit pattern was successfully formed without defects.

What is claimed is:

1. A process for the formation of a conductive circuit pattern on a base metal formed on a substrate, which comprises the following steps:
   providing on the base metal a plating resist in a pattern corresponding to the circuit to be formed and then forming a circuit pattern by plating;
   treating the plating resist with a stripper and then with a stripping residue remover to cut off chemical bonds in the resist by a dehydrating decomposition reaction; and
   treating the base metal with an etchant for the base metal, whereby any resist residue still remaining after the treatment with the stripping residue remover is removed and the base metal is etched at areas which have been covered by the plating resist.

2. The process of claim 1, wherein ultrasonic waves are applied to the stripping residue remover upon treatment with the stripping residue remover.

3. The process of claim 1, wherein the stripping residue remover is sprayed onto the substrate upon treatment with the stripper residue remover.

4. The process of claim 1, wherein washing is conducted under ultrasonic waves in water subsequent to the treatment with the stripping residue remover.

5. The process of claim 1, wherein washing is conducted by spraying water subsequent to the treatment with the stripping residue remover.

6. The process of claim 1, wherein the etching step comprises a first etching step in which the resist residue is removed and a second etching step in which the base metal is etched, and the first and second etching steps are conducted independently.

7. The process of claim 6, wherein the first etching step is conducted using an etchant having a lower etch rate than an etchant in the second etching step.

8. The process of claim 6, wherein the etch rate of the base metal in the first etching step is not higher than 1 $\mu$m/min.

9. The process of claim 6, wherein ultrasonic waves are applied to the etchant in the first etching step.

10. The process of claim 6, wherein the etchant is sprayed against the substrate in the first etching step.

11. The process of claim 6, wherein washing is conducted under ultrasonic waves in water subsequent to the first etching step.

12. The process of claim 6, wherein washing is conducted by spraying water subsequent to the first etching step.

13. The process of claim 1, wherein the stripping residue remover is sulfuric acid.

14. A process for the formation of a conductive circuit pattern, which comprises the following steps:
   providing a second base metal layer on a first base metal layer formed on a substrate;
   providing on the second base metal a plating resist in a pattern corresponding to the circuit to be formed and then forming a circuit pattern by plating;
   treating the plating resist with a stripper and then with a stripping residue remover to cut off chemical bonds in the resist by a dehydrating decomposition reaction;
   treating, as a first etching step, the second base metal layer with an etchant for the second base metal layer, whereby the second base metal layer and any resist residue are removed; and
   etching, as a second etching step, the first base metal layer with an etchant for the first base metal layer subsequent to the first etching step.

15. The process of claim 14, wherein the etch rate of the first base metal layer by the etchant used in the first etching step is lower than the etch rate of the first base metal layer by the etchant used in the second etching step.

16. The process of claim 15, wherein the etch rate of the first base metal layer in the first etching step is not higher than 1 $\mu$m/min.

17. The process of claim 14, wherein ultrasonic waves are applied to the stripping residue remover upon treatment with the stripping residue remover.

18. The process of claim 14, wherein the stripping residue remover is sprayed onto the substrate upon treatment with the stripping residue remover.

19. The process of claim 14, wherein washing is conducted under ultrasonic waves in water subsequent to the treatment with the stripping residue remover.

20. The process of claim 14, wherein washing is conducted by spraying water subsequent to the treatment with the stripping residue remover.

21. The process of claim 14, wherein utlrasonic waves are applied to the etchant in the first etching step.

22. The process of claim 14, wherein the etchant is sprayed against the substrate in the first etching step.

23. The process of claim 14, wherein washing is conducted under ultrasonic waves in water subsequent to the first etching step.

24. The process of claim 14, wherein washing is conducted by spraying water subsequent to the first etching step.

25. The process of claim 14, wherein the stripping residue remover is sulfuric acid.

26. The process of a claim 25, wherein the sulfuric acid is concentrated sulfuric acid having a concentration of at least 60 wt. %.

27. The process of claim 26, wherein the concentrated sulfuric acid has a concentration of at least 80 wt. % and the treatment with the concentrated sulfuric acid is conducted at 30° C. or higher.

28. The process of claim 14, wherein the first base metal layer and the circuit pattern formed with the plating resist are both made of copper, and the second base metal layer is an alloy layer or a multilayer composed of at least two layers, said alloy layer or multilayer being made of one or more metals selected from the group consisting of gold, platinum, nickel, cobalt, chromium, tin, zinc and iron.

29. The process of claim 28, wherein the thickness of the second base metal layer is not greater than 0.1 $\mu$m.

30. The process of claim 14, wherein the plating is electroless copper plating.

31. A process for the formation of a conductive circuit pattern on a base metal formed on a substrate, which comprises the following steps:
   providing on the base metal a plating resist in a pattern corresponding to the circuit to be formed and then forming a circuit pattern by plating;
   treating the plating resist with a resist remover to cut off chemical bonds in the resist by a dehydrating decomposition reaction; and
   treating the base metal with an etchant for the base metal whereby any resist remaining after the treatment with the resist remover is removed and the base metal is etched at areas which have been covered by the plating resist.

32. The process of claim 31, wherein the etching step comprises a first etching step in which the resist is removed and a second etching step in which the base metal is etched, and the first and second etching steps are conducted independently.

33. The process of claim 1, wherein the stripping residue remover is selected from the group consisting of sulfuric acid, hydrobromic acid, hydroiodic acid, and alcohol solutions of hydroxides of alkali metals.

34. The process of claim 14, wherein the stripping residue remover is selected from the group consisting of sulfuric acid, hydrobromic acid, hydroiodic acid, and alcohol solutions of hydroxides of alkali metals.

35. The process of claim 1, wherein the resist includes a compound containing at least one of (a) at least one ester bond and (b) at least one ether bond.

36. The process of claim 35, wherein the resist includes a compound containing at least one of (a) at least one ester bond and (b) at least one ether bond.

* * * * *